(12) United States Patent
Hofrichter et al.

(10) Patent No.: US 12,322,717 B2
(45) Date of Patent: Jun. 3, 2025

(54) SEMICONDUCTOR DEVICE AND METHOD FOR MANUFACTURING A SEMICONDUCTOR DEVICE

(71) Applicants: ams AG, Premstaetten (AT); Commissariat à l'énergie atomique et aux énergies alternatives, Paris (FR)

(72) Inventors: Jens Hofrichter, Premstaetten (AT); Manuel Kaschowitz, Premstaetten (AT); Bernhard Poelzl, Premstaetten (AT); Karl Rohracher, Premstaetten (AT); Amandine Jouve, Premstaetten (AT); Viorel Balan, Premstaetten (AT); Romain Crochemore, Premstaetten (AT); Frank Fournel, Premstaetten (AT); Sylvain Maitrejean, Premstaetten (AT)

(73) Assignees: AMS AG, Premstaetten (AT); COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 402 days.

(21) Appl. No.: 17/607,194

(22) PCT Filed: Mar. 30, 2020

(86) PCT No.: PCT/EP2020/058973
§ 371 (c)(1),
(2) Date: Oct. 28, 2021

(87) PCT Pub. No.: WO2020/221532
PCT Pub. Date: Nov. 5, 2020

(65) Prior Publication Data
US 2022/0223554 A1    Jul. 14, 2022

(30) Foreign Application Priority Data
May 2, 2019   (EP) .................................... 19172269

(51) Int. Cl.
*H01L 23/48*     (2006.01)
*B81B 7/00*      (2006.01)
(Continued)

(52) U.S. Cl.
CPC ............ *H01L 24/08* (2013.01); *B81B 7/0006* (2013.01); *B81C 1/00238* (2013.01);
(Continued)

(58) Field of Classification Search
CPC ............... H01L 24/03–08; H01L 24/80; H01L 2224/03031–056031; H01L 2224/8081
See application file for complete search history.

(56) References Cited

U.S. PATENT DOCUMENTS 7,201,636 B2   4/2007   Jin et al.
8,802,538 B1   8/2014   Liu et al.
(Continued)

FOREIGN PATENT DOCUMENTS

CN    103426732 A    12/2013
EP    2863420 A1     4/2015
(Continued)

OTHER PUBLICATIONS

European Extended Search Report in corresponding EP Application No. 19172269.3 mailed on Dec. 3, 2019, 10 pages.
(Continued)

*Primary Examiner* — Hoa B Trinh
(74) *Attorney, Agent, or Firm* — MH2 Technology Law Group LLP

(57) ABSTRACT

A semiconductor device comprises a substrate body with a surface, a conductor comprising a conductor material covering at least part of the surface, and a dielectric that is arranged on a part of the surface that is not covered by the conductor. Therein, the conductor is in contact with the substrate body, the conductor and the dielectric form a layer,
(Continued)

and a bonding surface of the layer has surface topographies of less than 10 nm, with the bonding surface facing away from the substrate body. Moreover, the semiconductor device is free of a diffusion barrier.

17 Claims, 5 Drawing Sheets

(51) Int. Cl.
*B81C 1/00* (2006.01)
*H01L 21/00* (2006.01)
*H01L 23/00* (2006.01)

(52) U.S. Cl.
CPC .............. *H01L 24/03* (2013.01); *H01L 24/05* (2013.01); *H01L 24/80* (2013.01); *B81B 2207/017* (2013.01); *H01L 2224/03616* (2013.01); *H01L 2224/03901* (2013.01); *H01L 2224/05124* (2013.01); *H01L 2224/05166* (2013.01); *H01L 2224/05184* (2013.01); *H01L 2224/05624* (2013.01); *H01L 2224/05666* (2013.01); *H01L 2224/05684* (2013.01); *H01L 2224/05687* (2013.01); *H01L 2224/08121* (2013.01); *H01L 2224/08147* (2013.01); *H01L 2224/80895* (2013.01); *H01L 2224/80896* (2013.01); *H01L 2924/1433* (2013.01); *H01L 2924/1461* (2013.01)

(56) References Cited

U.S. PATENT DOCUMENTS

| | | | |
|---|---|---|---|
| 8,802,541 B2 | 8/2014 | Wang et al. | |
| 9,027,821 B2 | 5/2015 | Di Cioccio et al. | |
| 9,620,385 B2 | 4/2017 | Rivoire et al. | |
| 9,893,028 B2 | 2/2018 | Yu et al. | |
| 10,115,637 B2* | 10/2018 | Fenouillet-Beranger | H01L 21/823828 |
| 2012/0153484 A1* | 6/2012 | Sadaka | H01L 21/76856 438/455 |
| 2013/0307165 A1 | 11/2013 | Wang et al. | |
| 2016/0086899 A1 | 3/2016 | Tong et al. | |
| 2016/0181228 A1* | 6/2016 | Higuchi | H01L 25/0657 257/774 |
| 2017/0186715 A1 | 6/2017 | Yu et al. | |
| 2020/0035641 A1* | 1/2020 | Fountain, Jr. | H01L 21/78 |
| 2020/0098711 A1* | 3/2020 | Choi | H01L 27/14618 |
| 2021/0375790 A1* | 12/2021 | Oda | H01L 24/80 |

FOREIGN PATENT DOCUMENTS

| | | |
|---|---|---|
| EP | 3005409 | 4/2016 |
| EP | 3207564 | 8/2017 |

OTHER PUBLICATIONS

Rebhan et al., "Low-Temperature Aluminum-Aluminum Wafer Bonding", ECS Transactions, (2016), vol. 75, No. 9, pp. 15-24.

International Search Report and Written Opinion in corresponding International Application No. PCT/EP2020/058973 mailed on Jun. 12, 2020, 16 pages.

Chinese Office Action issued in corresponding Chinese Patent Application No. 202080047967.9, dated Mar. 22, 2025, with English Language Translation, 26 pages.

\* cited by examiner

SEMICONDUCTOR DEVICE AND METHOD FOR MANUFACTURING A SEMICONDUCTOR DEVICE

CROSS-REFERENCE TO RELATED APPLICATIONS

The present application is the national stage entry of International Patent Application No. PCT/EP2020/058973, filed on Mar. 30, 2020, and published as WO 2020/221532 A1 on Nov. 5, 2020, which claims the benefit of priority of European Patent Application No. 19172269.3, filed on May 2, 2019, all of which are incorporated by reference herein in their entirety.

FIELD OF THE INVENTION

The present disclosure relates to a semiconductor device with a bonding surface, to a hybrid bonded semiconductor device comprising a semiconductor device with a bonding surface, and to a method of manufacturing said semiconductor device.

BACKGROUND OF THE INVENTION

In various applications, semiconductor components are realized as hybrid structures in which individual elements are assembled towards the end of the fabrication process in a face-to-face manner, for example by means of wafer bonding techniques. Typical examples for such hybrid structures are electronic components that comprise two chips or integrated circuit wafers. The two elements in these examples may be a CMOS element and a sensor element, such as a MEMS sensor element. For coupling the two elements to each other in order to form the hybrid device without requiring an adhesive, processed bonding surfaces with planarized structures of the individual elements are essential for achieving efficient bonding. Limitations of planarization methods, however, typically lead to a complicated fabrication process with an extensive bill of materials.

Therefore, typically wafer-bonding techniques are used to integrate the sensor with CMOS electronics. Among these techniques are eutectic bonding, anodic bonding, fusion bonding and thermo-compression bonding. The present disclosure focuses on direct bonding structures and methods of fabrication thereof.

SUMMARY OF THE INVENTION

An object to be achieved is to provide an improved concept of a semiconductor device with a planarized surface and a method of manufacturing such a semiconductor device.

This object is achieved with the subject-matter of the independent claims. Embodiments and developments of the improved method are defined in the dependent claims.

Typically, for manufacturing an integrated circuit semiconductor device, a dual damascene manufacturing process is performed, in which copper is used as a back-end-of-line (BEOL), metal interconnect. However, due to the property of copper of easily diffusing into surrounding materials, a layer of a barrier material has to be arranged in between in order to chemically isolate surrounding semiconductor materials from the copper while at the same time maintaining an electrical connection between them. Additionally, for planarizing and hence achieving the required atomically flat bonding surface, a chemical mechanical polishing, CMP, step is performed using a highly selective slurry in order to prevent over-polishing of the copper. A typical slurry for this process contains ceria and thus introduces a significant degree of contamination, which has to be eliminated by means of additional cleaning steps.

A further disadvantage of the described dual damascene process is its availability in 300 mm wafer CMOS fabrication processes. For CMOS compatible processing of 200 mm wafers that typically have a non-copper BEOL metallization, such as an aluminum, existing bonding preparation methods resorting to the dual damascene technique cannot be applied. Rather, a more traditional bonding preparation method resorting to metal deposition, lithography and etching is required.

The improved concept aims at enabling hybrid bonding without the use of such dual damascene metallization techniques, wherein the hybrid bonding can also be employed in 200 mm wafer fabrication processes. The concept is based on the idea of providing a semiconductor device manufactured according to a new manufacturing method for hybrid bonding layers that does not employ diffusion barriers and that results, by employing a new CMP process, in an enhanced planarity of a hybrid bonding pad following. The hybrid bonding pad is achieved by metal deposition, lithography and etching. Subsequent oxide deposition and chemical mechanical polishing enables such a surface suitable for hybrid bonding.

In particular, a semiconductor device according to the improved concept comprises a substrate body with a surface and a conductor comprising a conductor material covering at least part of the surface. The semiconductor device further comprises a dielectric arranged on a part of the surface that is not covered by the conductor. Therein, the conductor is in contact with the substrate body, the conductor and the dielectric form a layer, and a bonding surface of the layer has surface topographies of less than 10 nm, wherein the bonding surface is facing away from the substrate body. Moreover, the device is free of a diffusion barrier.

The substrate body, for example, comprises a substrate of a semiconductor material such as silicon and may comprise active circuitry, for example an application-specific integrated circuit, ASIC, for readout purposes, which is arranged on a surface of the substrate or partially or completely within the substrate. The surface of the substrate body may be the top or the bottom surface with respect to the fabrication process.

The conductor material forming the conductor is electrically conductive and arranged on the surface of and in contact with the semiconductor body. The conductor is formed by patterning and structuring of the conductor material, for instance. The dielectric is, for example, an oxide and is arranged on parts of the surface that is not covered by the conductor, such that the surface is entirely or substantially covered by the conductor and the dielectric. The dielectric and the conductor form a layer, on other words a thickness of the conductor corresponds to a thickness of the dielectric, wherein the thickness for both elements is determined in a vertical direction with respect to the surface, which for example corresponds to the normal vector of the main extension plane of the substrate body.

The bonding surface is a surface of the layer facing away from the substrate body. As the bonding surface is planarized, i.e., atomically flat with surface topographies of less than 10 nm, the bonding surface is suitable to be used as a bonding surface in standard wafer bonding techniques. In particular, the bonding surface is suitable for adhesive free bonding techniques such as direct bonding.

The semiconductor device is free of a diffusion barrier. In other words, no barrier metal is arranged in between the substrate body and the conductor and in between the dielectric and the conductor. The employment of a diffusion barrier, for example by means of a titanium-based metallization, is not compatible with certain fabrication processes such as 200 mm CMOS-compatible wafer processing. In contrast, the semiconductor device according to the improved concept follows from a simplified manufacturing process that is not bound to a specific processing, such as a dual damascene process, which is only compatible with certain wafer sizes, for instance.

In some embodiments, the conductor material comprises one of aluminum, titanium, tungsten, silicon, nitride or any combination thereof.

Depending on the desired specifications of the conductor, for example in terms of electrical conductivity and/or manufacturing process compatibility, a suitable conductor material may be chosen from a variety of materials that are compatible with a CMOS process without being limited to copper, on which a conventional dual damascene process is based on. The listed materials all show suitable electrical conductivities while at the same time not showing the property of diffusing into other materials such as a material of the substrate body, in particular into dielectric materials such as oxides.

In some embodiments, the oxide material comprises one of silicon dioxide, silicon nitride, silicon oxinitride, hafnium dioxide, tantalum pentoxide, SiCN, SiCOH, or any combination thereof.

In some embodiments, the conductor comprises a sacrificial material, which is arranged on a surface of the conductor material facing away from the substrate body, and comprises a conductive material, such as titanium nitride, that is different from the conductor material.

A remaining layer of a material, for example a sacrificial layer that is not entirely removed during the manufacturing process, may be arranged on a surface of the conductor material facing away from the substrate body. In these embodiments, the bonding surface comprises a surface of the dielectric and a surface of the sacrificial material which is arranged on the conductor material. Likewise comprising a conductive material, such as titanium nitride, the sacrificial material may serve the purpose of promoting a bonding to a further semiconductor device.

In addition or alternatively, a remaining layer of sacrificial material may be beneficial in some applications as it may result in a significant reduction in electrical resistance. For example, a remaining TiN sacrificial layer prevents the formation of an oxygen-rich Ti-layer at a Ti—SiO2 interface, which would otherwise lead to an undesired large electrical resistance.

In another embodiment, the sacrificial material may be entirely removed so that the bonding surface comprises a surface of the conductor material.

In some embodiments, the substrate body comprises an insulating layer, such as an oxide layer, that is arranged on a substrate, such as a silicon substrate. Therein, the surface is a surface of the insulating layer facing away from the substrate.

Following CMOS-compatible processing, the substrate body may comprise an insulating layer, for example an oxide layer, which is arranged on a substrate that acts as a support. For example, the substrate is a silicon substrate. In these embodiments, the surface is a surface of the insulating layer, on which both the dielectric and the conductor according to the improved concept are arranged.

The above-mentioned object is further achieved by a semiconductor hybrid device that comprises a semiconductor device according to one of the embodiments described above, and a further semiconductor device with a further bonding surface, wherein the semiconductor device is bonded to the further semiconductor device.

A hybrid device is for example a device comprising two chips or two wafers that are combined via standard wafer bonding techniques. Therein, the two components of the hybrid device may be manufactured independently and bonded towards the end of the manufacturing process. In particular, a surface of the further semiconductor device, for instance a planarized surface, is bonded to the process surface of the semiconductor device according to the improved concept. This strategy may be employed if the fabrication process of one of the semiconductor devices is not compatible with the fabrication of the other semiconductor device of the hybrid device, for instance. Examples of such hybrid devices include sensors such as imaging, environmental, MEMS CMOS and chemical sensors as well as optoelectronic devices in general.

In some embodiments, the semiconductor device is a CMOS device and the further semiconductor device is a MEMS and/or CMOS device.

Particularly the above-mentioned sensor types often comprise active circuitry of an ASIC for electrically reading out properties of the sensor portion of the hybrid device. CMOS-compatible fabrication of active circuitry, however, is not necessarily compatible with the fabrication of MEMS structures due to the employment of incompatible materials such as certain metals, for instance. Therefore, a MEMS device that in some embodiments also comprises MEMS-compatible CMOS structures may be fabricated independently from the readout ASIC device and bonded to the latter towards the end of the fabrication process.

In some embodiments, the further semiconductor device is a semiconductor device according to one of the embodiments described above.

In order to keep the manufacturing process of the entire hybrid device as simple and cost-efficient as possible, both semiconductor devices may be embodiments of a semiconductor device according to the improved concept. Furthermore, both semiconductor devices comprising a bonding surface with surface topographies of less than 10 nm additionally allow for efficient bonding of the two components.

The above-mentioned object is further achieved by a method of manufacturing a semiconductor device. The method comprises providing a substrate body with a surface, depositing a conductor on the surface, and patterning and structuring the conductor. The method further comprises depositing a dielectric on the conductor, in particular the structured conductor, and on exposed parts of the surface, and creating a bonding surface of the semiconductor device by removing part of the dielectric using a plurality of chemical-mechanical polishing, CMP, steps. Therein, the bonding surface has surface topographies of less than 10 nm.

Providing the substrate body for example means providing a substrate and depositing an insulating layer on the substrate such that the surface is a surface of the insulating layer facing away from the substrate. The substrate is a silicon substrate, for example a wafer or a chip, and the insulating layer is an oxide layer, for instance. The substrate body may comprise active circuitries such as an ASIC. The surface of the substrate body may be the top or the bottom surface with respect to the fabrication process of the substrate body.

Depositing the conductor means depositing a conductive material, such as a metal, on the surface of the substrate body. For example, the conductor material comprises depositing one of aluminum, titanium, tungsten, silicon, nitride or any combination thereof.

Patterning and structuring the conductor may be performed by means of lithography, such as photo or electron beam lithography, in combination with a wet or dry etching step. Patterning and structuring therefore exposes parts of the surface of the substrate body while the remaining structured conductor forms a conductor stack on the surface, wherein the conductor stack is in contact with the substrate body.

Depositing the dielectric means depositing a dielectric material onto exposed parts of the surface and onto the conductor such that the conductor is buried in the dielectric. In other words, a thickness of the dielectric measured from the surface of the substrate body in a vertical direction perpendicular to a main extension plane of the substrate body is at least as large as the thickness of the conductor.

For example, the plurality of CMP steps comprises a first and a second step of CMP. In such an embodiment, creating the bonding surface means first applying the first step of CMP in order to remove the dielectric at least until the thickness of the dielectric corresponds to the thickness of the conductor. Therein, a material of the conductor may act as a stop layer for the first step of CMP. After the first step of CMP, in the second step of CMP further dielectric, and possibly part of the conductor, is removed. In other words, the thickness of the dielectric and the conductor are reduced concurrently such that after the second step of CMP the bonding surface, comprising surfaces of the dielectric and the conductor facing away from the substrate body, is atomically flat, i.e. has surface topographies of less than 10 nm.

In particular, the method does not include applying a diffusion barrier. Therefore, the method according to the improved concept is compatible with a wide range of fabrication processes such as 100 mm, 200 mm and 300 mm CMOS-compatible processes, for instance.

In some embodiments, the method further comprises bonding a further semiconductor device, in particular via wafer-to-wafer or die-to-wafer hybrid bonding, to the bonding surface.

In some embodiments, depositing the conductor comprises depositing a conductor material on the surface and depositing a sacrificial material on the conductor material. In these embodiments, creating the bonding surface comprises removing at least part of the sacrificial material.

Depositing the sacrificial material means depositing a material, which may be a conductive material, on the conductor material. A thickness of the sacrificial material may be less or equal to a thickness of the conductor material. In some embodiments, however, the thickness of the sacrificial material may extend the thickness of the conductor material.

In such embodiments, the sacrificial material of the conductor may act as a stop layer for the first step of CMP. Moreover, in the second step of CMP further dielectric as well as at least part of the sacrificial material is removed. In other words, the thickness of the dielectric and the sacrificial material are reduced concurrently such that after the second step of CMP the bonding surface, comprising surfaces of the dielectric and the sacrificial material facing away from the substrate body, is atomically flat, i.e. has surface topographies of less than 10 nm.

In some further embodiments, depositing the sacrificial material comprises depositing a conductive material, in particular titanium nitride, which differs from the conductor material. Alternatively, depositing the sacrificial material comprises depositing a dielectric material that differs from the dielectric.

In some further embodiments, the sacrificial material is not entirely removed during the second step of CMP such that sacrificial material remains on the finalized device. In order to provide electrical conductivity of the conductor formed by the conductor stack, the sacrificial material in these embodiments is conductive. For example, the sacrificial material is titanium nitride which has both sufficient conductivity and decent bonding properties. Alternatively, the sacrificial material is of a dielectric material different from that of the dielectric such that the desired atomically smooth bonding surface can be achieved.

In addition or alternatively, a remaining layer of sacrificial material may be beneficial in some applications as it may result in a significant reduction in electrical resistance of a bond when bonding the bonding surface to a bonding surface of a further semiconductor device.

In some further embodiments, the sacrificial material is completely removed during the second step of CMP.

In some cases, it may be desirable to keep a thickness of the conductor as small as possible. To this end, the second step of CMP may be performed such that the entire sacrificial material is removed and the conductor is merely defined by the structured conductor material.

In some embodiments of the method, the plurality of CMP steps are performed consecutively, in particular without intermediate metal deposition.

Performing the steps of CMP directly back to back means that the entire manufacturing process remains reasonable while keeping the bill of materials short, leading to a significantly cheaper manufacturing process compared to dual damascene recipes.

In some embodiments, at least one of the plurality of CMP steps is a timed CMP step.

In order to facilitate the fabrication and/or in cases in which the conductor material and/or the sacrificial material do not act as a stop layer for CMP, timed CMP steps can be employed to achieve the desired thickness and surface roughness of the bonding surface. For example, a first step of CMP is timed to terminate when the dielectric is removed to a point at which the sacrificial material of the conductor is exposed, while a second step of CMP is timed to terminate when the sacrificial material reaches a certain thickness or is removed completely.

In some embodiments, the plurality of CMP steps differ from each other in terms of slurry composition and/or material selectivity.

The slurry used during a first step of CMP may target the removal of the dielectric. For example, it is standard silicon dioxide slurry. During a second step, a different slurry may be employed that removes the dielectric as well as the sacrificial material at a similar, if not equal, rate. For example, the second step of CMP reduces the thickness of the dielectric at a lower rate than the first step of CMP but therefore has a selectivity of nearly unity regarding the dielectric and the sacrificial material. Optionally, the selectivity of the second slurry is likewise unity regarding the conductor material and the dielectric. For example, the first and the second slurry are standard non-ceria based slurries that do not introduce contaminations and therefore do not require subsequent cleaning steps for removing contaminants from polished surfaces.

In other embodiments, the second slurry may have a selectivity regarding the dielectric and the sacrificial material that is different from unity. For example, the selectivity is in the range between 0.9 and 1.1 in order to optimize micro topographies on the bonding surface to achieve improved bonding results.

In some embodiments, the bonding surface is to be bonded to a further bonding surface of a further semiconductor device.

BRIEF DESCRIPTION OF THE DRAWINGS

The following description of figures of exemplary embodiments may further illustrate and explain aspects of the improved concept. Components and parts of the semiconductor device with the same structure and the same effect, respectively, appear with equivalent reference symbols. Insofar as components and parts of the semiconductor device correspond to one another in terms of the function in different figures, the description thereof is not repeated for each of the following figures.

DETAILED DESCRIPTION

FIG. 1A to 1E show cross sections of intermediate steps of an exemplary manufacturing method of a semiconductor device 1 according to the improved concept. In this embodiment, a second step of chemical-mechanical planarization, CMP, entirely removes the sacrificial material 5b deposited on the conductor material 5a.

Figure 1A:
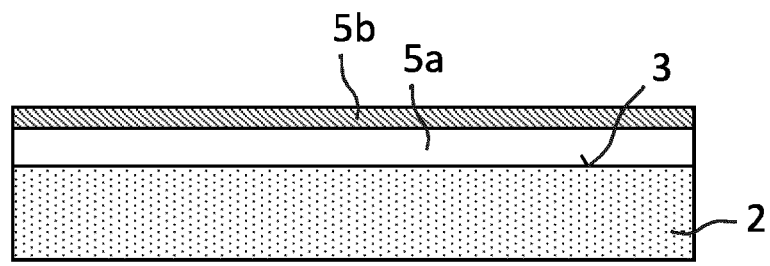
FIGS. 1A to 1E show cross sections of intermediate steps of an exemplary embodiment of the improved manufacturing method of a semiconductor device.

FIG. 1A shows a cross section of an intermediate product of a semiconductor device 1 after depositing a layer of conductor material 5a on a surface 3 of a substrate body 2, and a layer of sacrificial material 5b on a surface of the layer of conductor material 5a facing away from the substrate body 2. The substrate body 2 comprises a substrate material, which may be silicon. The substrate body 2 may also comprise an integrated circuit, which may in particular be a CMOS circuit with active and/or passive circuitry. Such integrated circuits are known per se, and are not shown in the figures. The substrate body 2 at this stage may be a wafer or a chip diced from a wafer, for instance. The surface 3 of the substrate body 2 is, for example, a surface parallel to the main extension plane of the substrate body 2 and may be referred to as a top surface without loss of generality.

The layer deposited on the surface 3 is of a conductor material 5a, such as aluminum, titanium, tungsten, silicon, nitride or any combination thereof. A thickness of said layer typically is in the order of 300 nm to 3 μm but can also be smaller or larger depending on specific requirements of the finalized conductor 5 of the semiconductor device 1.

The layer of sacrificial material 5b is deposited on a surface of the layer of conductor material 5a that faces away from the substrate body 2. The sacrificial material 5b may either be a conductive material, such as titanium nitride, that is different from the conductor material 5a, or a dielectric material, such as an oxide. A thickness of said layer may be smaller or larger than the layer of the conductor material 5a or be equal in thickness, depending on requirements of subsequent steps of the fabrication process, for instance. Typically, the sacrificial material 5b is deposited with a thickness in the order of 100 nm to 1 μm.

Figure 1B:
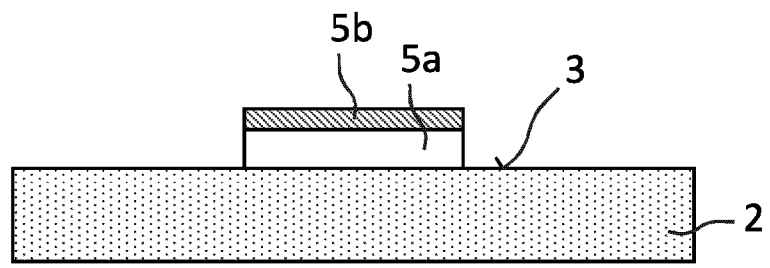

FIG. 1B shows a cross section of the intermediate product according to FIG. 1A after patterning and structuring the conductor material 5a and the sacrificial material 5b. The patterning and structuring may be performed by means of lithography, such as photo or electron beam lithography, in combination with a wet or dry etching step. Patterning and structuring therefore exposes parts of the surface 3 of the substrate body while the remaining structured conductor material 5a and sacrificial material 5b form a conductor stack on the surface 3, wherein the conductor stack is in contact with the substrate body 2.

Figure 1C:
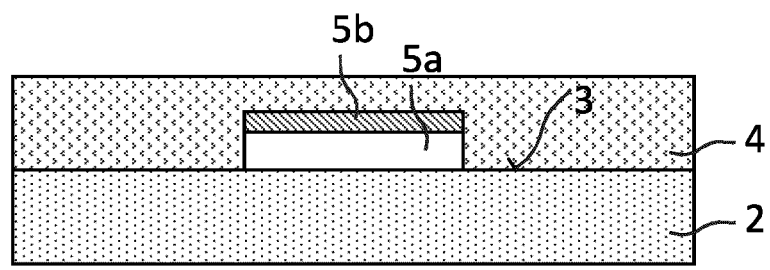

FIG. 1C shows a cross section of the intermediate product according to FIG. 1B after depositing a dielectric 4. Depositing the dielectric 4 means depositing a dielectric material on the conductor stack and onto the surface 3 of the substrate body. The dielectric material is thereby different from the sacrificial material. For example, the dielectric material is an oxide such as silicon dioxide. The deposition of the dielectric 4 is performed such that the conductor stack is buried in the dielectric 4. In other words, a thickness of the dielectric 4 measured from the surface 3 of the substrate body 2 in a vertical direction perpendicular to a main extension plane of the substrate body 2 is at least as large as the thickness of the conductor stack.

Figure 1D:
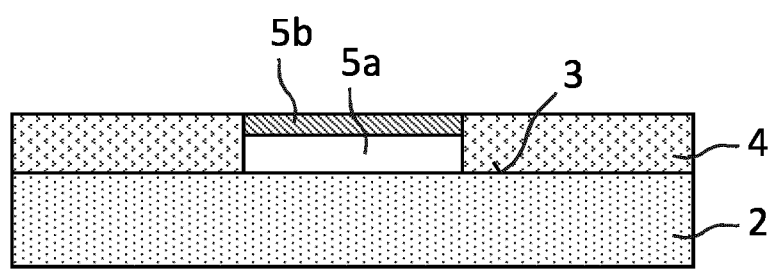

FIG. 1D shows a cross section of the intermediate product according to FIG. 1C after a first step of CMP. During this first step, part of the dielectric 4 is removed such that the dielectric 4 is reduced in thickness at least until the sacrificial material 5b is exposed. In some cases, the first step of CMP may be performed to a point at which also a thickness of the sacrificial material 5b is reduced. However, the sacrificial material 5b is not completely removed during the first step of CMP. The first step of CMP for example is performed using a first slurry that is configured to remove the dielectric material. For example, the first slurry is a standard silicon dioxide slurry.

Figure 1E:
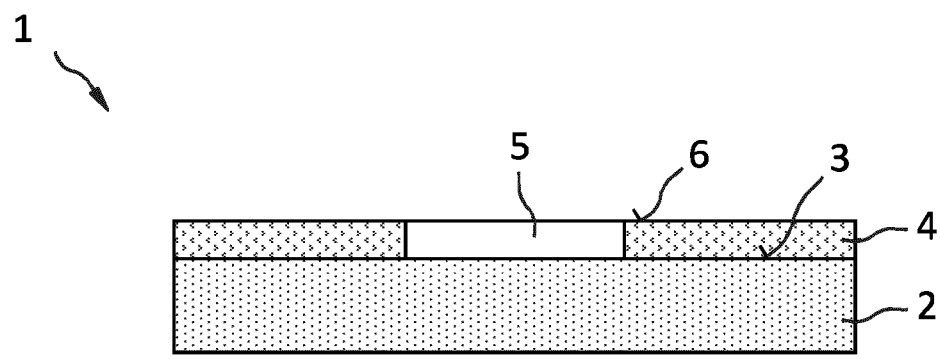

FIG. 1E shows a cross section of the semiconductor device 1 according to FIG. 1E after a second step of CMP. During this second step that may also be referred to as a buffing step, the dielectric 4 and the sacrificial material 5b could be removed until the conductor material 5a is exposed to form the finalized conductor 5. After this step, the conductor 5 and the dielectric 4 form a layer 8, meaning that a thickness of the conductor 5 corresponds to a thickness of the dielectric 4. As a result, the bonding surface 6 is a surface of said layer 8. The second step of CMP differs from the first step of CMP in terms of slurry composition and/or material selectivity, for instance. For example, a selectivity of the slurry between the dielectric 4 and the sacrificial material 5b is unity such that both materials are evenly removed. In some cases, the second slurry may have a selectivity regarding the dielectric 4 and the sacrificial material 5b that is different from unity. For example, the selectivity is in the range between 0.9 and 1.1 in order to optimize micro topographies to achieve improved results.

For example, the second slurry does not contain contaminants, such as ceria, that would leave residues on any planarized surface and hence would require further steps of cleaning.

The second step of CMP hence leads to the planarized bonding surface 6 of the semiconductor device 1 that is characterized by surface topographies of less than 10 nm size and therefore may be regarded as atomically smooth.

Figure 2:
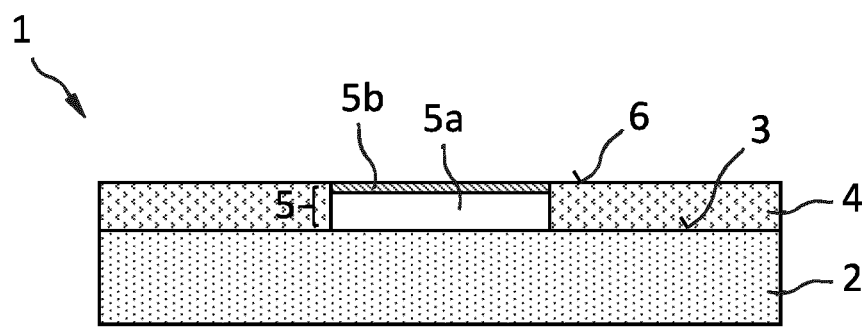
FIG. 2 shows a cross section of an alternative embodiment of the semiconductor device manufactured following an alternative embodiment of the manufacturing method.

FIG. 2 shows a cross section of an alternative embodiment of the semiconductor device manufactured following an alternative embodiment of the manufacturing method of a semiconductor device 1 compared to that of FIGS. 1A to 1E. In this embodiment, the sacrificial material 5b is not entirely removed during the second step of CMP and therefore remains as part of the conductor 5 on the finalized semiconductor device 1, as illustrated in FIG. 2.

In this embodiment, the sacrificial material 5b is a conductive material and together with the conductor material 5a form the finalized conductor 5 of the semiconductor device 1. Leaving a layer of the sacrificial material 5b on the finalized semiconductor device 1 may have the advantage that the sacrificial material 5b promotes a bonding to a further semiconductor device. A thickness of the sacrificial material 5b on the finalized product may be up to 50 nm. A suitable choice for the sacrificial material in this case is titanium nitride, for instance.

Figure 3:
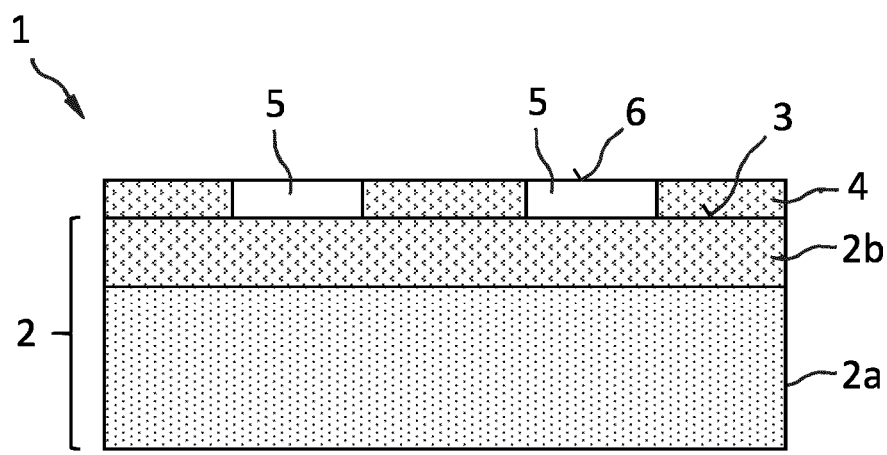
FIG. 3 shows a cross section of an exemplary embodiment of a semiconductor device.

FIG. 3 shows an embodiment of the semiconductor device 1 comprising multiple conductors 5 on the surface 3 of the semiconductor body. The fabrication is analogous to that shown in FIGS. 1A to 1E. Multiple conductors 5 may be required for providing connections to multiple points of an integrated circuit comprised by the substrate body 2.

A further difference is that the substrate body 2 in this embodiment comprises besides a substrate 2a also an insulating layer 2b to provide electrical insulation of active circuitry of the substrate body 2, for example. The insulating material may be the same as the dielectric 4, such as silicon dioxide.

Figure 4:
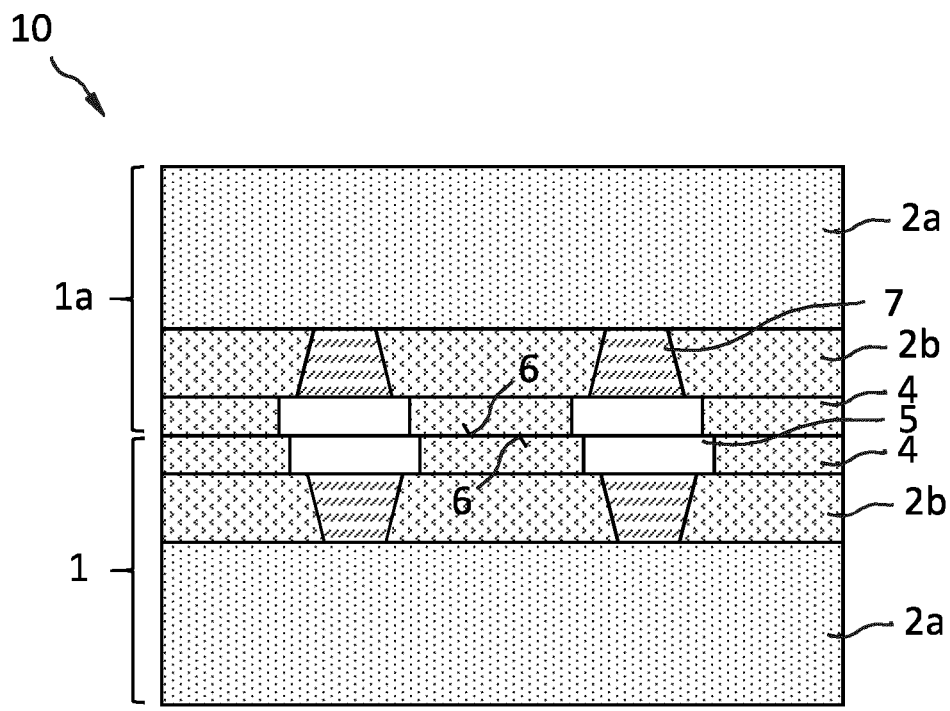
FIG. 4 shows a cross section of an exemplary embodiment of a hybrid semiconductor device.

FIG. 4 shows a cross section of an exemplary embodiment of a hybrid semiconductor device 10 comprising two semiconductor devices 1, 1a according to the improved concept. The bonding surfaces 6 of the semiconductor devices 1, 1a are bonded to each other by means of direct wafer bonding, for instance. For example, the first semiconductor device 1 is a CMOS device comprising active circuitry for evaluating signals from a transducer while the further semiconductor device 1a is a MEMS device comprising said transducer.

For providing electrical interconnections, the conductors 5 of the semiconductor devices 1, 1a are connected to active and/or passive circuitry by means of vias 7, such as tungsten vias, for example. The conductors 5 are dimensioned such that offsets due to an imperfect bonding or manufacturing tolerances only insignificantly, if at all, influence the electrical interconnection.

Figure 5:
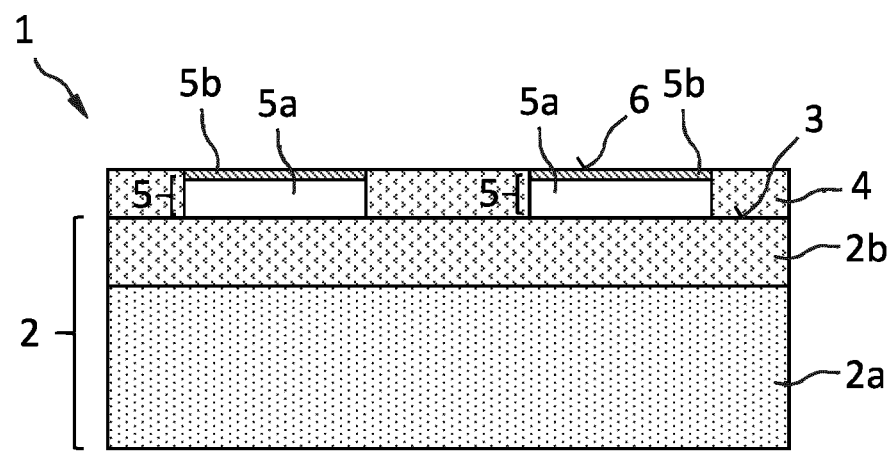
FIG. 5 shows a cross section of a further exemplary embodiment of a semiconductor device.
Figure 6:
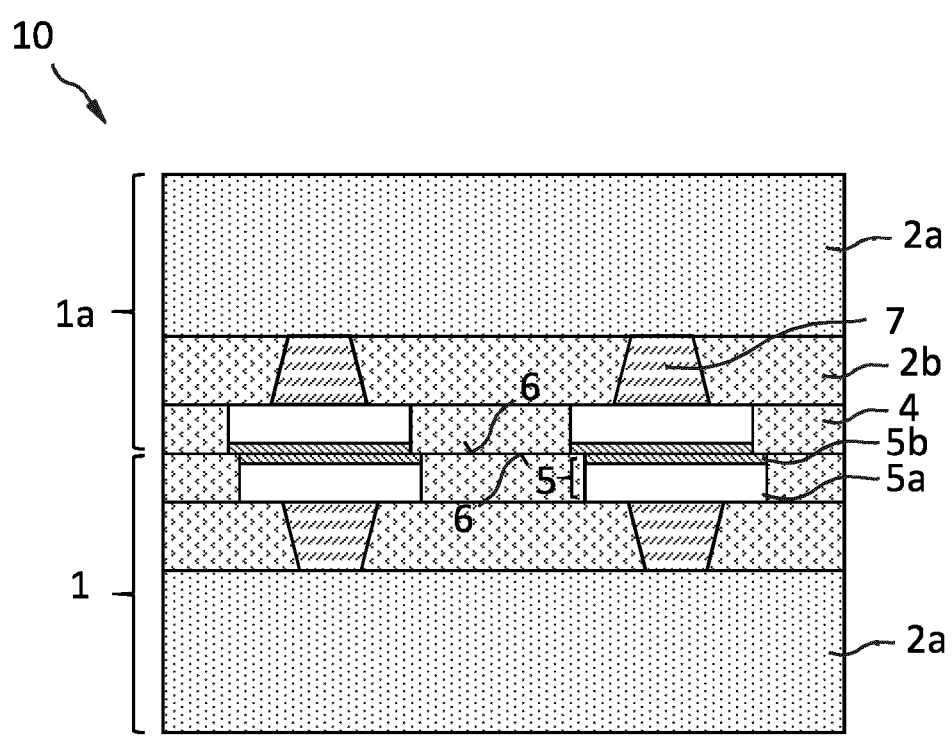
FIG. 6 shows a cross section of a further exemplary embodiment of a hybrid semiconductor device.

FIGS. 5 and 6 shows alternative embodiments of the semiconductor device 1 and the semiconductor hybrid device 10, respectively. Compared to those embodiments shown in FIGS. 3 and 4, these embodiments are characterized by residual sacrificial material 5b on the conductor material 5a of each semiconductor device 1, 1a. As described in line with the embodiment of the semiconductor device of FIG. 2, the residual sacrificial material 5b may be beneficial for bonding and lead to an improved result in some cases.

The embodiments shown in the FIGS. 1A to 6 as stated represent exemplary embodiments of the semiconductor device 1, of the semiconductor hybrid device 10, as well as of the manufacturing method according to the improved concept. Therefore they do not constitute a complete list of all embodiments according to the improved concept. Actual semiconductor device configurations may vary from the embodiments shown in terms of shape, size and materials, for example.

The invention claimed is:

1. A semiconductor device comprising:
    a substrate body with a surface;
    a conductor comprising a conductor material covering at least part of the surface; and
    a dielectric arranged on a part of the surface that is not covered by the conductor; wherein
    the conductor is in contact with the substrate body;
    the conductor and the dielectric form a layer;
    a bonding surface of the layer has surface topographies of less than 10 nm, with the bonding surface facing away from the substrate body;
    the semiconductor device is free of a diffusion barrier; and
    the conductor comprises a sacrificial material, which is arranged on a surface of the conductor material facing away from the substrate body and comprises a conductive material that is different from the conductor material, wherein a thickness of the sacrificial material is less than or equal to a thickness of the conductor material,
    wherein the dielectric and the sacrificial material form the bonding surface that is planarized to the surface topographies.

2. The semiconductor device according to claim 1, wherein the conductor material comprises one of aluminum, titanium, tungsten, silicon, nitride or any combination thereof.

3. The semiconductor device according to claim 1, wherein
    the substrate body comprises an insulating layer, such as an oxide layer, that is arranged on a substrate, such as a silicon substrate; and
    the surface is a surface of the insulating layer facing away from the substrate.

4. A semiconductor hybrid device comprising
    the semiconductor device according to claim 1; and
    a further semiconductor device with a further bonding surface;
    wherein the semiconductor device is bonded to the further semiconductor device.

5. The semiconductor hybrid device according to claim 4, wherein
    the semiconductor device is a CMOS device; and
    the further semiconductor device is a MEMS and/or CMOS device.

6. The semiconductor hybrid device according to claim 4, wherein the further semiconductor device and the semiconductor device are a same type of semiconductor device.

7. A method of manufacturing a semiconductor device comprising:
    providing a substrate body with a surface;
    depositing a conductor on the surface;
    patterning and structuring the conductor;
    depositing a dielectric on the conductor and on exposed parts of the surface; and
    creating a bonding surface of the semiconductor device by removing part of the dielectric using a plurality of chemical-mechanical planarization, CMP, steps;
    wherein the bonding surface has surface topographies of less than 10 nm, wherein depositing the conductor comprises depositing a conductor material on the surface and depositing a sacrificial material on the conductor material, the sacrificial material being a conductive material that differs from the conductor material, wherein creating the bonding surface comprises removing at least part of the sacrificial material, wherein a thickness of the sacrificial material is less than or equal to a thickness off the conductor material, and wherein the dielectric and the sacrificial material form the bonding surface that is planarized to the surface topographies.

8. The method according to claim 7, further comprising hybrid bonding a further semiconductor device to the bonding surface.

9. The method according to claim 7, wherein the sacrificial material is completely removed during the plurality of CMP steps.

10. The method according to claim 7, wherein the plurality of CMP steps are performed consecutively.

11. The method according to claim 7, wherein at least one of the plurality of CMP steps is a timed CMP step.

12. The method according to claim 7, wherein the plurality of CMP steps differ from each other in terms of slurry composition and/or material selectivity.

13. The method according to claim 7, wherein the plurality of CMP steps comprises a dielectric removal step and a buffing step.

14. The method according to claim 7, wherein
a first of the plurality of CMP steps is performed using a first slurry that predominantly removes the dielectric; and
a second of the plurality of CMP steps is performed using a second slurry that has a selectivity regarding the dielectric and a material of the conductor, that is between 0.9 and 1.1.

15. The method according to claim 7, wherein slurries used during the plurality of CMP steps are non-ceria based slurries.

16. The method according to claim 7, wherein the method of manufacturing is CMOS-compatible.

17. A method of manufacturing a semiconductor device comprising:
providing a substrate body with a surface;
depositing a conductor on the surface;
patterning and structuring the conductor;
depositing a dielectric on the conductor and on exposed parts of the surface; and
creating a bonding surface of the semiconductor device by removing part of the dielectric using a plurality of chemical-mechanical planarization (CMP) steps;
wherein the bonding surface has surface topographies of less than 10 nm;
wherein depositing the conductor comprises depositing a conductor material on the surface and depositing a sacrificial material on the conductor material, the sacrificial material being a conductive material that differs from the conductor material; and
creating the bonding surface comprises removing at least part of the sacrificial material,
wherein a layer of the sacrificial material is left on the semiconductor device, and
wherein the dielectric and the layer of the sacrificial material form the bonding surface that is planarized to the surface topographies.

* * * * *